US007677353B2

(12) United States Patent
Shinohara et al.

(10) Patent No.: US 7,677,353 B2
(45) Date of Patent: Mar. 16, 2010

(54) NOISE SUPPRESSION STRUCTURE

(75) Inventors: Kazuhiro Shinohara, Ehime (JP); Shiro Kikuchi, Ehime (JP); Yutaro Kan, Ehime (JP); Damion Edward Manns, London, OH (US)

(73) Assignee: Nissen Chemitec Corporation, Ehime (JP)

( * ) Notice: Subject to any disclaimer, the term of this patent is extended or adjusted under 35 U.S.C. 154(b) by 0 days.

(21) Appl. No.: 12/193,310

(22) Filed: Aug. 18, 2008

(65) Prior Publication Data

US 2009/0050402 A1 Feb. 26, 2009

(30) Foreign Application Priority Data

Aug. 20, 2007 (JP) ............................ 2007-213784

(51) Int. Cl.
*H05K 5/03* (2006.01)
*H04R 1/02* (2006.01)
*H05K 5/02* (2006.01)

(52) U.S. Cl. ...................... 181/150; 181/151; 381/391; 381/389

(58) Field of Classification Search ................. 181/199, 181/150, 151; 381/391, 86, 333, 388, 389, 381/189, 301, 302
See application file for complete search history.

(56) References Cited

U.S. PATENT DOCUMENTS

| | | | | |
|---|---|---|---|---|
| 2,115,098 | A * | 4/1938 | Engholm | 181/150 |
| 3,666,040 | A * | 5/1972 | Junk | 181/150 |
| 4,281,224 | A * | 7/1981 | Castagna | 381/391 |
| 4,325,455 | A * | 4/1982 | Kirkpatrick | 181/148 |
| 4,853,966 | A * | 8/1989 | Skrzycki | 381/395 |
| 4,891,842 | A * | 1/1990 | Green | 381/392 |
| 4,919,227 | A * | 4/1990 | Chicoine | 181/175 |
| 4,974,698 | A * | 12/1990 | Smith | 181/150 |
| 5,113,968 | A * | 5/1992 | Lemmon | 181/148 |
| 5,322,979 | A * | 6/1994 | Cassity et al. | 181/150 |
| 5,412,162 | A * | 5/1995 | Kindel | 181/150 |
| 5,416,283 | A * | 5/1995 | Dault et al. | 181/150 |
| 5,565,659 | A * | 10/1996 | Moner et al. | 181/150 |
| 5,652,413 | A * | 7/1997 | Mulera | 181/141 |
| 5,717,171 | A * | 2/1998 | Miller et al. | 181/150 |
| 5,731,551 | A * | 3/1998 | Petrucci | 181/150 |
| 5,734,131 | A * | 3/1998 | Sakamoto | 181/141 |
| 5,736,689 | A * | 4/1998 | Van Hout et al. | 181/141 |
| 5,750,942 | A * | 5/1998 | Flick | 181/141 |
| 5,754,664 | A * | 5/1998 | Clark et al. | 381/86 |
| 5,754,669 | A * | 5/1998 | Shiota et al. | 381/386 |
| 5,844,999 | A * | 12/1998 | Kameda et al. | 381/386 |
| 6,258,438 | B1 * | 7/2001 | Loveland et al. | 428/137 |
| 6,354,397 | B1 * | 3/2002 | Combest et al. | 181/199 |
| 6,364,053 | B1 * | 4/2002 | Huerth | 181/199 |
| 6,505,705 | B1 * | 1/2003 | Espiritu et al. | 181/150 |
| 6,661,898 | B2 * | 12/2003 | Kuwabara | 381/87 |
| 6,694,036 | B2 * | 2/2004 | Makino | 381/389 |
| 7,218,745 | B2 * | 5/2007 | McConnell et al. | 381/302 |
| 7,346,181 | B2 * | 3/2008 | Rivera | 381/391 |
| 7,443,994 | B2 * | 10/2008 | Suzuki | 381/386 |
| 7,543,681 | B2 * | 6/2009 | Howard et al. | 181/150 |

(Continued)

*Primary Examiner*—Edgardo San Martin
(74) *Attorney, Agent, or Firm*—Lucas & Mercanti, LLP

(57) ABSTRACT

In a noise suppression structure of the present invention, a sound absorption sheet is pinched between a flange of a speaker grille and an interior trim. An opening of a space formed by the flange of the speaker grille and a sound guiding tube is covered with the sound absorption sheet.

3 Claims, 4 Drawing Sheets

U.S. PATENT DOCUMENTS

2007/0098206 A1* 5/2007 Ando et al. ................. 381/391
2007/0147649 A1* 6/2007 Takase et al. ............... 381/396
2007/0169988 A1* 7/2007 Chang ........................ 181/199
2007/0177754 A1* 8/2007 Kemmerer .................. 381/391

* cited by examiner

NOISE SUPPRESSION STRUCTURE

BACKGROUND OF THE INVENTION

1. Field of the Invention

The present invention relates to a noise suppression structure for preventing noise such as friction sound and reverberation caused when sound from a speaker vibrates a speaker grille.

2. Background Art

For placing a speaker of a vehicle audio system in an interior of a vehicle (e.g. a car), a recess 2*a* for fitting a speaker grille 4 is formed in a position corresponding to a speaker opening 2 in an interior trim 1 (the position where the speaker grille 4 is attached), as shown in FIG. 4. The speaker opening 2 is opened in the recess 2*a*, and a speaker 3 is disposed in the speaker opening 2. The speaker grille 4 is fitted in the recess 2*a* so as to cover the speaker opening 2.

The speaker grille 4 is provided to protect the speaker 3 from an external shock and improve the appearance. The sound from the speaker 3 passes through sound holes 5 which are formed in a ceiling board 4*a* of the speaker grille 4. A flange 4*b* is formed in the periphery of the ceiling board 4*a* of the speaker grille 4. The speaker grille 4 can be detachably attached to the interior trim 1 by engaging hooks 8 provided at the end of the flange 4*b* with engaging holes la opened in the interior trim 1. A cylindrical-shaped sound guiding tube 6 for carrying sound from the speaker 3 to the sound holes 5 efficiently is extended downward from the ceiling board 4*a* of the speaker grille 4. The speaker grille 4 is detachably attached to the interior trim 1 for maintenance of the speaker 3.

The sound from the speaker 3 passes through the sound guiding tube 6 and the sound holes 5 of the speaker grille 4 and reaches the ears of a passenger.

The sound from the speaker 3 also vibrates the speaker grille 4. In the structure where the speaker grille 4 is detachably attached to the interior trim 1, when the speaker grille 4 vibrates, friction sound may be generated at contact parts between the speaker grille 4 and the interior trim 1 (specifically, each of retaining pars K1 between the engaging holes 1*a* and the hooks, contact part between an outer face K2 of the flange 4*b* and the interior trim 1 and contact part between a lower edge K3 of the flange 4*b* and the interior trim 1). And the friction sound is a noise offensive to the ear.

To address the problem, conventionally, non-woven fabric 7 is adhered to the contact parts of the speaker grille 4, the retaining part K1, the outer face K2 of the flange 4*b*, and the lower edge K3. Generally, adhesive material is provided on the back side of the non-woven fabric 7. With the adhesive material, the non-woven fabric 7 is adhered to the speaker grille 4).

As described above, adhesion of the non-woven fabric 7 to the parts K1 to K3 contacting with the interior trim 1 of the speaker grille 4, friction sound is generated between the speaker grille 4 and the interior trim 1.

However, adhesion of the non-woven fabric 7 piece by piece to the contact parts K1 to K3 is too complicated to be automated easily. Consequently, the non-woven fabric 7 is conventionally manually adhered. Such the manual work is very time consuming and inefficient which results in a variability in quality by workers.

In addition, there is the case that the adhesive material provided on the back side of the non-woven fabric 7 contains a hazardous material such as VOC (Volatile Organic Compound). When the hazardous material diffuses in a small vehicle compartment, it may be harmful to the health of a passenger.

Further, even when the generation of the friction sound is suppressed with adhering the non-woven fabric 7, a new problem arises such that another type of noise which had been hidden by the friction sound. Specifically, when the speaker grille 4 vibrates, the vibration sound generated at this time reverberates in a space X formed between the flange 4*b* and the sound guiding tube 6 of the speaker grille 4, and the reverberation becomes the new problem.

SUMMARY OF THE INVENTION

An object of the present invention is to provide a noise suppression structure which can be easily and reliably assembled, eliminating the influence of hazardous material such as VOC and, moreover, preventing noise such as frictional sound and reverberation due to vibration of a speaker grille.

According to a first aspect of the present invention, a noise suppression structure 10 has;

an interior trim 12 having an opening for speaker 20 and engaging holes 22 opened around the opening for speaker 20;

a speaker 18 facing the opening for speaker 20;

a speaker grille 14 attached to the interior trim 12 so as to close the speaker opening 20, including a ceiling board 14*a* having sound holes 24 allowing passage of sound from the speaker 18, a flange 14*b* extended downward from outer periphery of the ceiling board 14*a*, a sound guiding tube 32 extended downward from the ceiling board 14*a* so as to surround the speaker 18, and hooks 30 that engage with the engaging holes 22; and a sound absorption sheet 16 pinched between the flange 14*b* of the speaker grille 14 and the interior trim 12 except portions between the hooks 30 and the engage holes 22, having a sound guiding tube insertion hole 34 allowing insertion of the sound guiding tube 32, and covering an opening of a space X formed with the flange 14*b* and the sound guiding tube 32.

In the present invention, the sound absorption sheet 16 is pinched between the flange 14*b* of the speaker grille 14 and the interior trim 12. Consequently, even when the speaker grille 14 vibrates with the sound from the speaker 18, the vibration is absorbed by the sound absorption sheet 16 at the pinched portion, and no friction noise is generated. On the other hand, in the portion other than the flange 14*b* of the speaker grille 14, the hooks 30 are engaged/contacted directly with the engaging holes 22. However, since there are no allowances in each of the engagement portions between the hooks 30 and the engaging holes 22 by pinching the sound absorption sheet 16 with sufficient elasticity. Consequently, the generation of friction sound at these portions is largely reduced. In addition, the sound absorption sheet 16 contacts with the speaker grille 14 around the hooks 30 and is pinched between the speaker grille 14 and the interior trim 12. The friction sound which generated even slightly is absorbed by the sound absorption sheet 16 and is reduced to inaudible sound.

Reverberation transmitted to the space X between the flange 14*b* of the speaker grille 14 and the sound guiding tube 32 (i.e. vibration sound generated by vibrating the speaker grille 14 and transmitted into the space X) is efficiently absorbed with the sound absorption sheet 16 covering the opening of the space X. Consequently, reverberation which causes another type of noise is not generated in the space X.

Further, the noise suppression structure 10 can be reliably assembled with the simple work that covering the opening in the space X between the flange 14*b* of the speaker grille 14 and the sound guiding tube 32 with the sound absorption sheet 16 and attaching the speaker grille 14 in which the opening in the space X is covered with the sound absorption sheet 16 to the interior trim 12. When assembling the noise suppression structure 10, work variations among workers do not occur. Moreover, the adhesive material conventionally used for attaching the sound absorption sheet 16 is not necessary. Thus, unlike the conventional technique, hazardous materials such as VOC are not diffused in a vehicle compartment.

The sound absorption sheet 16 may be made of woven fabric or non-woven fabric.

A number of voids S exist within the non-woven fabric or woven fabric, and the sound absorption effect with the voids S can be obtained. That is, when vibration sound generated by vibrating the speaker grille 14 and transmitted into the space X reaches to the sound absorption sheet 16, the vibration sound is converted to heat energy by "frictional resistance in the void S" and "resonance in the void S", and absorbed.

The noise suppression structure which can be easily and reliably assembled, eliminate the influence of a hazardous material such as VOC and, moreover, prevent generation of noise such as friction sound and reverberation generated by vibration of the speaker grille can be obtained.

The above and further objects and novel features of the invention will more fully appear from the following detailed description when the same is read in connection with the accompanying drawing. It is to be expressly understood, however, that the drawing is for purpose of illustration only and is not intended as a definition of the invention.

DETAILED DESCRIPTION OF THE PREFERRED EMBODIMENTS

Figure 1:
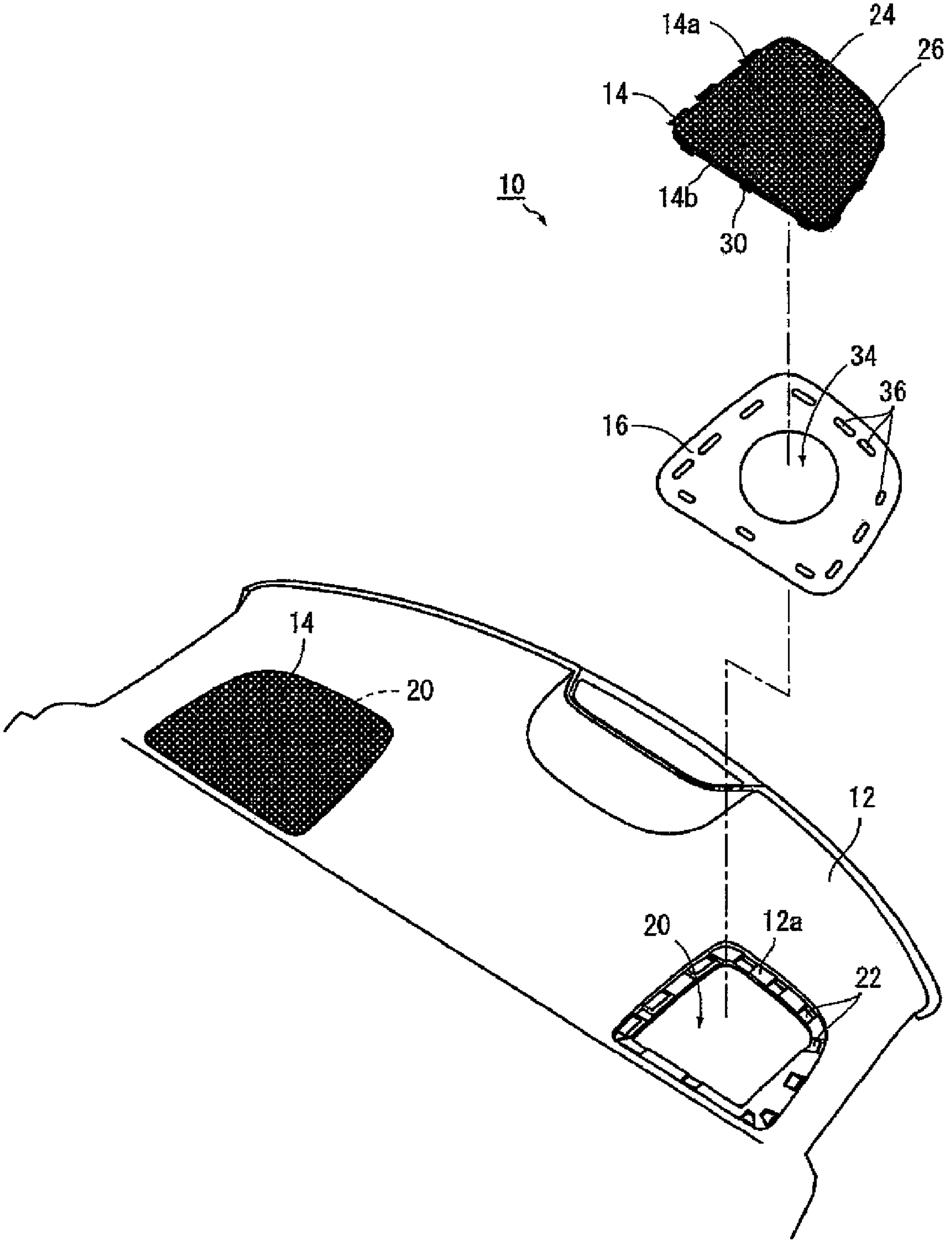
FIG. 1 is an exploded perspective view showing noise suppression structure for a speaker as an embodiment of the invention.
Figure 2:
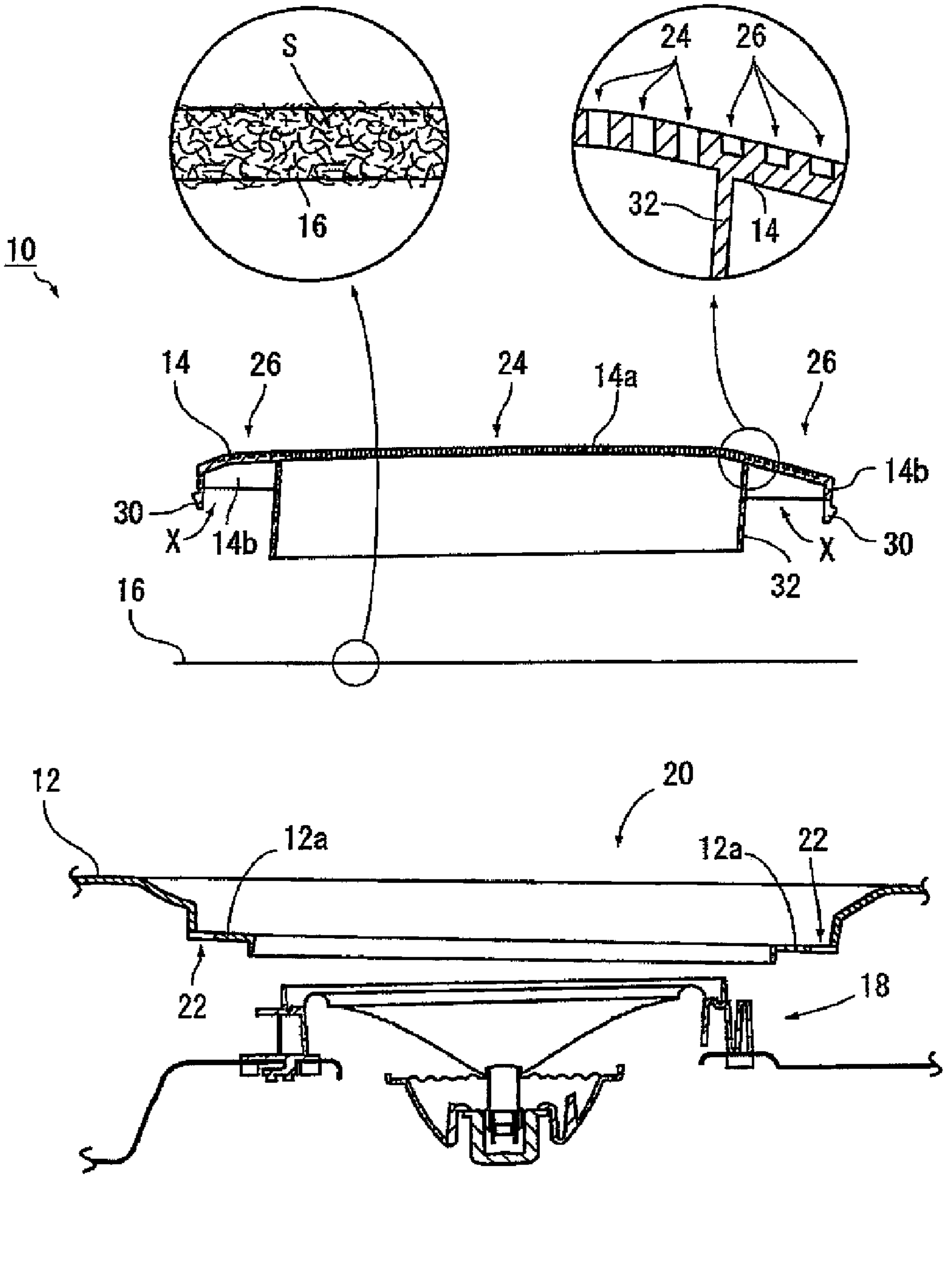
FIG. 2 is an exploded cross section showing the noise suppression structure for a speaker as the embodiment of the invention.

The noise suppression structure 10 is to prevent noise offensive to the ear such as friction sound and reverberation caused when sound from a speaker vibrates a speaker grille 14. As shown in FIGS. 1 and 2, the noise suppression structure 10 is constructed by an interior trim 12 of a vehicle, a speaker grille 14, a sound absorption sheet 16, and a speaker 18.

The interior trim 12 is a resin board constructing an interior surface of a vehicle. The outline of the interior trim 12 is formed in accordance with the shape of a rear part of a back seat. Speaker openings 20 are formed on both sides of the interior trim 12. The inner shape of the speaker opening 20 is formed in an almost square shape, but may be a circle shape or a triangle shape.

The edge of the speaker opening 20 in the interior trim 12 is formed in a step pattern. A plurality of engaging holes 22 (twelve holes in the embodiment) are formed in the step part of the speaker opening 20, that is, around a recess 12*a*.

The speaker grille 14 is provided to protect the speaker 18 from an external shock and to improve the appearance. The speaker grille 14 has a ceiling board 14*a*, a flange 14*b* extended downward from the entire outer periphery of the ceiling board 14*a*, and a sound guiding tube 32 having a cylindrical shape (the shape may be a cylinder, a rectangular cylinder, an elliptical cylinder, or the like), which are formed integrally. The speaker grille 14 is injection-molded using a synthetic resin, for example: PP (polypropylene); PE (polyethylene); PET (polyethylene terephthalate); PBT (polybutylene terephthalate); PVC (polyvinyl chloride); or ABS resin.

A plurality of sound holes 24 which allow passages of the sound from the speaker 18 are formed at the ceiling board 14*a* of the speaker grille 14 within the sound guiding tube 32 corresponding to the speaker 18. At the ceiling board 14*a* of the speaker grille 14 outside of the sound guiding tube 32, that is, around the area where the sound holes 24 are formed, a plurality of decorative blind holes 26 (or through holes) each having an inside diameter almost equal to that of the sound hole 24 are formed. Then, a visual effect can be produced as if the sound holes 24 are formed in the entire ceiling board 14*a* of the speaker grille 14.

Figure 3:
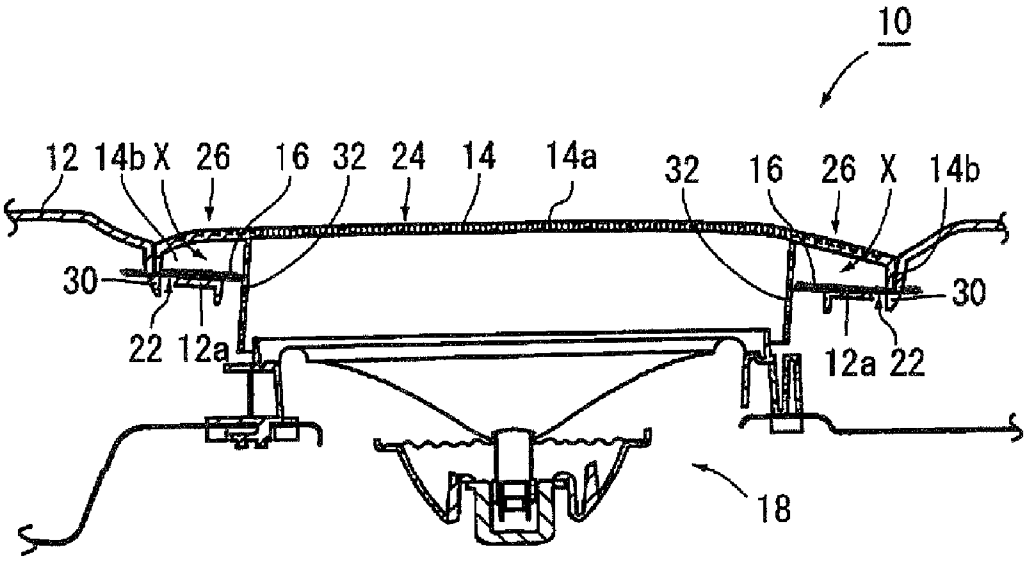
FIG. 3 is a cross section of the noise suppression structure for a speaker as the embodiment of the invention.
Figure 4:
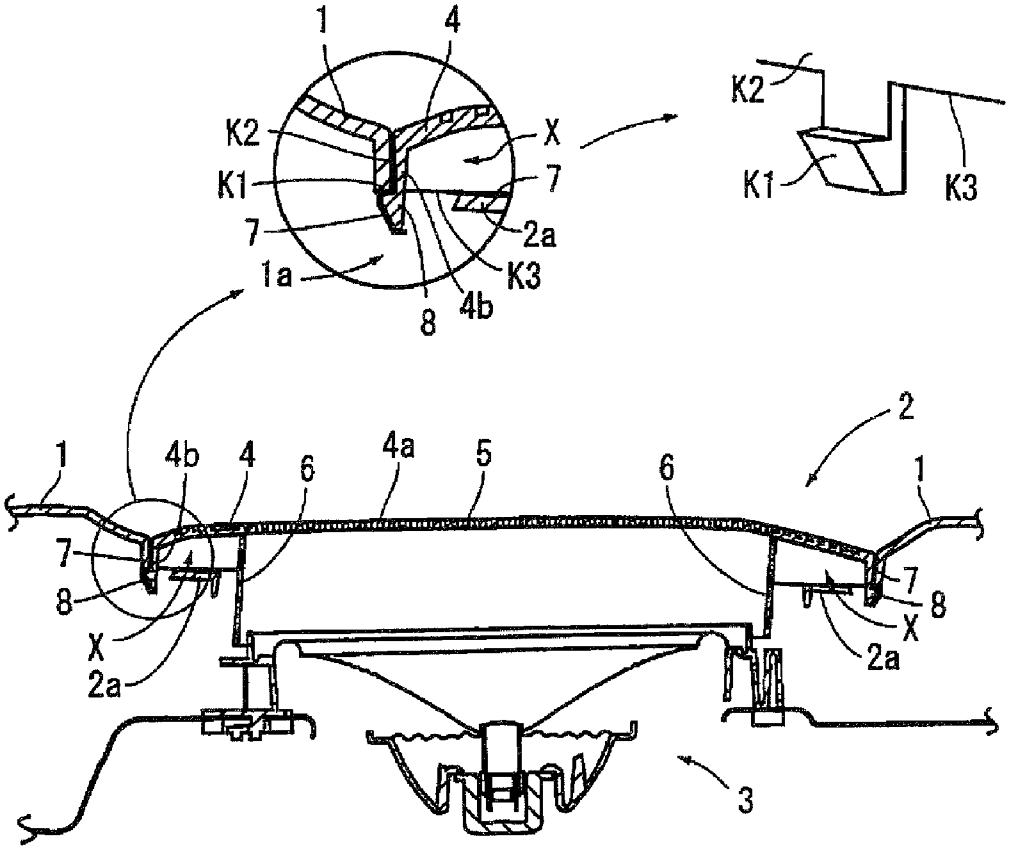
(PRIOR ART) FIG.4
FIG. 4 is a cross section showing a conventional noise suppression structure.

As described above, the sound guiding tube 32 for carrying sound efficiently from the speaker 18 is extended downward from the ceiling board 14*a* of the speaker grille 14 so as to surround the sound holes 24. The height of the sound guiding tube 32 is properly set so that the lower end of the sound guiding tube 32 is positioned near the speaker 18 so as to surround the speaker 18 when the speaker grille 14 is attached to the interior trim 12 (refer to FIG. 3).

A plurality of hooks 30 (twelve hooks in the embodiment, so as to match the number of engaging holes 22) to be engaged with the corresponding engaging holes 22 in the interior trim 12 are extended downward from the speaker grille 14. In the embodiment, each of the hooks 30 is extended downward integrally from the flange 14*b* of the speaker grille 14. The shape of the speaker grille 14 (the outer periphery of the flange 14*b*) is formed in accordance with the shape of the recess 12*a* as a step part of the interior trim 12.

The sound absorption sheet 16 is made of non-woven fabric. The size of the sound absorption sheet 16 is set to be larger than that of the speaker grille 14 so as to be able to cover the space X formed by the flange 14*b* of the speaker grille 14 and the sound guiding tube 32. At the center of the sound absorption sheet 16, a sound guiding tube insertion hole 34 (refer to FIG. 1) is formed at a position corresponding to the sound guiding tube 32 of the speaker grille 14. At outer periphery of the sound absorption sheet 16, a plurality of hooks insertion holes 36 (in the embodiment, twelve hook insertion holes 36 so as to match the number of hooks 30) for inserting the hooks 30 are formed at positions corresponding to the hooks 30.

Preferably, the thickness of the sound absorption sheet 16 is set in the range of 0.5 to 1.0 mm in consideration of the strength and the allowance between the speaker grille 14 and the interior trim 12 for attaching (in the embodiment, the thickness of the sound absorption sheet 16 is set to 0.5 mm).

The reason that the lower limit of the thickness of the sound absorption sheet 16 is set to 0.5 mm is to keep the strength of the sound absorption sheet 16 itself retaining. On the other hand, the reason that the upper limit of the thickness of the sound absorption sheet 16 is set to 1.0 mm is to keep the allowance between the speaker grille 14 and the interior trim 12 for attaching the speaker grille 14 to the interior trim 12.

The reason for selecting no-woven fabric as the material of the sound absorption sheet 16 is that innumerable fine openings are opened in the surface of non-woven fabric and communicate with a number of "voids S" in that. Vibration generated from the speaker grille 14 and transmitted to the sound absorption sheet 16 is converted to heat energy by "frictional resistance in the void S" and "resonance in the void S" and efficiently absorbed.

The material of the sound absorption sheet 16, therefore, is not limited to non-woven fabric but any material can be used as long as it has a number of "voids" in that and has the sound absorption effect produced by the "voids". For example, woven fabric or a resin foamed sheet having interconnecting cells or closed cells (in such case, innumerable fine openings are not formed in the surface but a number of "voids" exist on the inside of a surface layer and have the sound absorption effect) can be used as the sound absorption sheet 16.

For assembling the noise suppression structure 10, first, the hooks 30 of the speaker grille 14 is inserted into the hook insertion holes 36 in the sound absorption sheet 16. Then the sound guiding tube 32 of the speaker grille 14 is fitted in the sound guiding tube insertion hole 34 in the sound absorption sheet 16, and the attachment of the sound absorption sheet 16 to the speaker grille 14 is completed. The sound guiding tube insertion hole 34 in the sound absorption sheet 16 is not fixed to the speaker grille 14 but is free. When the sound absorption sheet 16 is attached to the speaker grille 14, the space X formed by the flange 14*b* of the speaker grille 14 and the sound guiding tube 32 is covered with the sound absorption sheet 16.

The hooks 30 of the speaker grille 14 inserted into the hook insertion holes 36 in the sound absorption sheet 16 are engaged with the engaging holes 22 formed in the recess 12*a* of the interior trim 12. The flange 14*b* of the speaker grille 14 is fitted in the recess 12*a* as the step part in the interior trim 12, and the sound absorption sheet 16 is pinched between the flange 14*b* of the speaker grille 14 and the interior trim 12 in a portion other than the hook 30, thereby completing assembly of the noise suppression structure 10.

The speaker grille 14 is vibrated with the sound. The sound absorption sheet 16 is pinched between the portion other than the hook 30 of the speaker grille 14 (the flange 14*b*) and the interior trim 12. In other words, the speaker grille 14 and the interior trim 12 are not in direct contact with each other. Even if the speaker grille 14 vibrates, therefore, friction noise is not generated between the flange 14*b* and the interior trim 12. On the other hand, in the part other than the pinching part of the speaker griller 14, that is, in the part other than the flange 14*b*, the hook 30 is directly in engagement and contact with the engaging hole 22. However, there is no allowance in each of the engaging parts between the hooks 30 and the engaging holes 22 by pinching the sound absorption sheet 16 with sufficient elasticity. Consequently, the generation of friction sound at these parts is largely reduced. In addition, as described above, the sound absorption sheet 16 contacts with the speaker grille 14 around the hooks 30 and is pinched between the speaker grille 14 and the interior trim 12. The friction sound generated even slightly is absorbed by the sound absorption sheet 16 and is reduced to inaudible sound.

Since the opening of the space X formed between the flange 14*b* of the speaker grille 14 and the sound guiding tube 32 is covered with the sound absorption sheet 16, vibration sound generated by vibration of the speaker grille 14 propagates in the space X and reaches to the sound absorption sheet 16. The sound absorption sheet 16 is made of non-woven fabric in which innumerable "voids S" exist. The sound reached to the sound absorption sheet 16, therefore, is converted to heat energy by "frictional resistance in the void S" and "resonance in the void S" and absorbed. Moreover, the sound guiding tube insertion hole 34 in the sound absorption sheet 16 is not fixed but is free. In other words, the sound absorption sheet 16 is a plane sheet which periphery is pinched and having a large hole in its center. The sound absorption sheet 16, therefore, does not easily resonate with sounds at all frequencies from low to high and effectively absorbs the sounds with the above-described mechanism.

As described above, vibration sound generated by vibration of the speaker grille 14 propagates in the space X and is absorbed by the sound absorption sheet 16. That means reverberation causing another noise is not generated in the space X.

For assembling the noise suppression structure 10, it is sufficient to cover the opening of the space X between the flange 14*b* of the speaker grille 14 and the sound guiding tube 32 with the sound absorption sheet 16 and attach the speaker grille 14 in which the opening of the space X is covered with the sound absorption sheet 16 to the interior trim 12. The assembly is simple and reliable. Consequently, work variations among workers do not occur for assembling the noise suppression structure 10. Moreover, the adhesive material conventionally used for attaching the sound absorption sheet 16 is not necessary. Thus, hazardous materials such as VOC are not diffused in a vehicle compartment space.

The disclosure of Japanese Patent Application No. 2007-213784 filed Aug. 20, 2007 including specification, drawings and claims is incorporated herein by reference in its entirety.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

What is claimed is:

1. A noise suppression structure comprising:
- an interior trim having a speaker opening and engaging holes around the speaker opening;
- a speaker facing the speaker opening;
- a speaker grill attached to the interior trim so as to close the speaker opening, including a ceiling board having sound holes allowing passage of sound from the speaker, a flange extended downward from outer periphery of the ceiling board, a sound guiding tube extended downward from the ceiling board so as to surround the speaker, and hooks that engage with the engaging holes; and
- a sound absorption sheet pinched between the flange of the speaker grill and the interior trim having plurality hook insertion holes at outer periphery for inserting the hooks and a sound guiding tube insertion hole at a central portion allowing insertion of the sound guiding tube, where said sound absorption sheet covers an opening of a space between the flange and the sound guiding tube.

2. The noise suppression structure according to claim 1, wherein the sound absorption sheet is made of woven fabric or non-woven fabric.

3. The noise suppression structure according to claim 1, wherein the sound absorption sheet having a thickness in the range of 0.5 to 1.0 mm.

* * * * *